US009455339B2

(12) United States Patent
Chan et al.

(10) Patent No.: US 9,455,339 B2
(45) Date of Patent: Sep. 27, 2016

(54) HIGH VOLTAGE DEVICE AND METHOD FOR MANUFACTURING THE SAME

(71) Applicant: MACRONIX INTERNATIONAL CO., LTD., Hsinchu (TW)

(72) Inventors: Wing-Chor Chan, Hsinchu (TW); Ying-Chieh Tsai, Chiayi (TW); Jeng Gong, Taichung (TW); Chia-Hui Cheng, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 48 days.

(21) Appl. No.: 14/480,728

(22) Filed: Sep. 9, 2014

(65) Prior Publication Data

US 2016/0071963 A1     Mar. 10, 2016

(51) Int. Cl.
*H01L 21/762* (2006.01)
*H01L 21/764* (2006.01)
*H01L 29/739* (2006.01)
*H01L 29/861* (2006.01)
*H01L 21/761* (2006.01)
H01L 29/06 (2006.01)

(52) U.S. Cl.
CPC ......... *H01L 29/7394* (2013.01); *H01L 21/761* (2013.01); *H01L 21/764* (2013.01); *H01L 21/76254* (2013.01); *H01L 29/0646* (2013.01); *H01L 29/861* (2013.01); *H01L 29/8611* (2013.01); *H01L 29/0649* (2013.01)

(58) Field of Classification Search
CPC ......... H01L 21/764; H01L 29/7816–29/7826; H01L 29/78–29/7926
See application file for complete search history.

(56) References Cited

U.S. PATENT DOCUMENTS

| 5,485,030 A * | 1/1996 | Terashima | H01L 29/0649 257/347 |
| 6,373,101 B1 * | 4/2002 | Suzumura | H01L 23/49562 257/341 |
| 7,667,267 B2 * | 2/2010 | Yamada | H01L 29/0653 257/335 |
| 7,906,388 B2 * | 3/2011 | Sonsky | H01L 21/76264 257/368 |
| 8,071,454 B1 * | 12/2011 | Akiyama | H01L 21/76251 257/E21.088 |
| 8,134,207 B2 * | 3/2012 | Watanabe | H01L 27/1203 257/343 |
| 8,524,548 B2 * | 9/2013 | French | H01L 29/0653 257/339 |
| 8,698,236 B2 | 4/2014 | Takeda et al. | |
| 2011/0133269 A1 * | 6/2011 | Yamaji | H01L 27/1203 257/328 |
| 2015/0041965 A1 * | 2/2015 | Schulze | H01L 29/402 257/655 |

FOREIGN PATENT DOCUMENTS

TW   201230207 A1   7/2012
TW   201312747 A1   3/2013

OTHER PUBLICATIONS

TIPO Office Action dated Apr. 6, 2016 in Taiwan application (No. 103127274).

* cited by examiner

*Primary Examiner* — Eric Ward
(74) *Attorney, Agent, or Firm* — McClure, Qualey & Rodack, LLP

(57) ABSTRACT

A high voltage (HV) device and method for manufacturing the same are provided, at least comprising a substrate, an insulation formed on the substrate, a deep well formed in the insulation, an air layer formed in the insulation and disposed adjacent to the bottom surface of the deep well. A bottom surface of the deep well is spaced apart from the substrate. Also, the air layer, interposed between the deep well and the substrate, is spaced apart from the substrate. In one embodiment, an air layer further communicates with an atmosphere outside the HV device, which facilitates heat dissipation.

17 Claims, 8 Drawing Sheets

HIGH VOLTAGE DEVICE AND METHOD FOR MANUFACTURING THE SAME

BACKGROUND

1. Field of the Invention

The disclosure relates in general to a high voltage device and a method for manufacturing the same, and more particularly to a high voltage device with improved electrical properties and the method for manufacturing the same.

2. Description of the Related Art

The latest technology developments in high voltage power ICs for applications such as SMPS, lighting, motor control or plasma display drives have focused on the enhancing efficiency, reliability, flexibility and ultimately reducing system level cost.

Flyback diode is normally used in an inductive load of an electrical circuit. It is more popular to form the flyback diode with control circuit on SOI process. However, the flyback diode on SOI suffers from strong heat accumulation. Thus, more heat needs to be dissipated, so that the power dissipation of the flyback diode is increased.

Lateral insulated gate bipolar transistor (LIGBT) devices are normally used in today's smart power technology with inductive load, which combine advantages of both the DMOS device (i.e. high input impedance, gate control) and the bipolar transistor (i.e. high current levels at low on-state voltage drop). LIGBT device can be combined in the power IC circuit. Similarly, it is more popular to form the high voltage LIGBT with control circuit on SOI process. The Breakdown voltage of the LIGBT on SOI has been restricted by the oxide thickness and the top Silicon thickness. The high voltage LIGBT on SOI also suffers from strong heat accumulation. Thus, more heat needs to be dissipated, so that the power loss is increased during IGBT turn-on and switching.

SUMMARY

The disclosure relates to a high voltage (HV) device and manufacturing method to form the HV device on partial silicon-on-insulator (SOI). With an air layer formed in the insulation, the electrical field of the HV device can be altered for increasing the breakdown voltage of the HV devices, thereby improving the electrical performance of HV device.

According to one embodiment of the present disclosure, a high voltage (HV) device is provided, at least comprising a substrate, an insulation formed on the substrate, a deep well formed in the insulation, an air layer formed in the insulation and disposed adjacent to the bottom surface of the deep well. A bottom surface of the deep well is spaced apart from the substrate. Also, the air layer, interposed between the deep well and the substrate, is spaced apart from the substrate.

According to another embodiment of the present disclosure, a high voltage (HV) device comprising the features as described above is provided, and the air layer also communicates with an atmosphere outside the HV device, which facilitates heat dissipation.

According to one embodiment of the present disclosure, a method for manufacturing a HV device is provided, comprising:

providing a substrate with an insulating layer thereon, and constructing an air layer in the insulating layer, using smart cut bonding procedures;

forming a deep well on the insulating layer, and a bottom surface of the deep well apart from the substrate; and forming a field oxide on the deep well, wherein the air layer is disposed adjacent to the bottom surface of the deep well, and spaced apart from the substrate.

The disclosure will become apparent from the following detailed description of the preferred but non-limiting embodiments. The following description is made with reference to the accompanying drawings.

DETAILED DESCRIPTION

Figure 1:
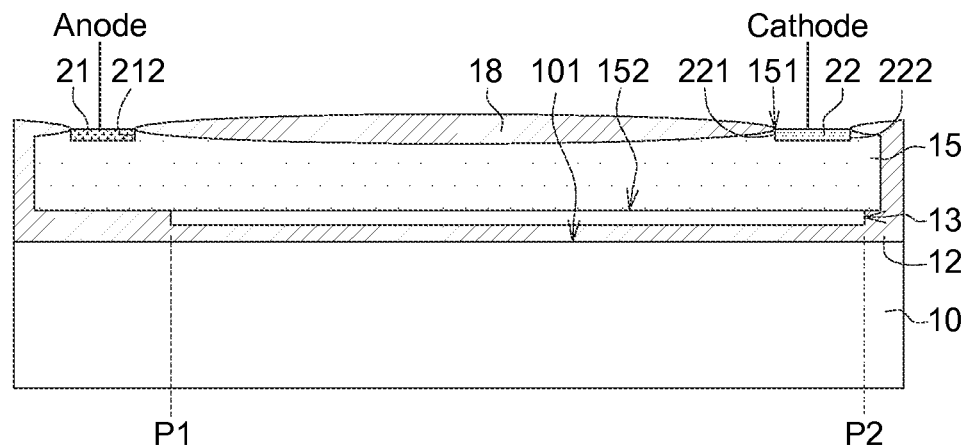
FIG. 1 illustrates a high voltage diode on partial SOI according to the first embodiment of the present disclosure.

In the embodiments of the present disclosure, a high voltage (HV) device and a method for manufacturing a HV device are provided. The embodiment of the present disclosure has used partial silicon-on-insulator (SOI) to form the high voltage power device, such as a diode, a bipolar junction transistor (BJT), a metal oxide semiconductor (MOS) or an insulated gate bipolar transistor (IGBT). In the embodiment, an air layer is constructed in the insulation on the substrate, and the air layer is positioned under the bottom surface of a deep well and spaced apart from the substrate. According to the embodiment, an electrical field of the applied device can be altered due to the formation of the air layer, such as increasing the peak of the electrical field near an anode of a diode, so as to effectively increase the breakdown voltage of the HV devices. Additionally, the air layer of some embodiments can communicate with the atmosphere outside the HV device, so that solves the problem of strong heat accumulation usually occurred in the HV device. With adequate design of the air layer, the heat can be quickly dissipated outside at a fast rate. According, the electrical performance of HV device of the embodiment can be greatly improved, since the conventional problems of low breakdown voltage and heat accumulation have been solved. Moreover, the method for manufacturing the HV device of the embodiment has adopted a smart cut SOI bonding technology to form the configuration of partial SOI, which is simple and contains no time-consuming and expensive procedures.

The embodiment of the present disclosure can be implemented in various HV devices in the applications. Examples of the applicable HV devices include diode (such as flyback diode), BJT, IGBT, and MOS such as EDMOS (enhanced diffused metal oxide semiconductor) and LDMOS (laterally diffused metal oxide semiconductor). Also, the details of the HV device may be modified to meet the requirement of the practical application; thus, the embodiments provided hereinafter are used for illustrating, not limiting, the structure of the HV devices of the embodiment and the manufacturing method thereof. The descriptions disclosed in the embodiments of the disclosure such as detailed structures, manufacturing procedures and material selections are for illustration only, not for limiting the scope of protection of the disclosure.

Embodiments are provided hereinafter with reference to the accompanying drawings for describing the related configurations and procedures, but the present disclosure is not limited thereto. It is noted that not all embodiments of the invention are shown. Structures and the manufacturing method of the embodiments would be different, and could be modified and changed optionally according to the type of the HV device in the application, the pattern of the air layer and the selected manufacturing procedures in practical applications. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

First Embodiment

FIG. 1 illustrates a high voltage diode on partial SOI according to the first embodiment of the present disclosure. In the first embodiment, configuration of the high voltage (HV) diode is exemplified for describing one of the applicable HV devices of the present disclosure.

As shown in FIG. 1, a high voltage diode at least comprises a substrate 10, an insulation 12 formed on the substrate 10, an air layer 13 formed in the insulation, and a deep well 15 formed in the insulation and on the air layer 13. A bottom surface 152 of the deep well 15 is spaced apart from the substrate 10. The air layer 13, which could be constructed as a blanket cavity or an air hole pattern, is disposed adjacent to the bottom surface 152 of the deep well 15 for adjusting an electric field of the device. Also, the air layer 13 is interposed between the deep well 15 and the substrate 10, and the air layer 13 is spaced apart from (the top surface 101 of) the substrate 10 (i.e. the air layer 13 and the substrate 10 are separated by the insulation 12).

As shown in FIG. 1, the high voltage diode further comprises a first doping region 21 and a second doping region 22 extending downwardly from a top surface 151 of the deep well 15. In one embodiment, the first doping region 21 and the second doping region 22 are separated by a field oxide (FOX) 18. According to the embodiment, two opposite ends of the air layer 13 are positioned adjacent to the first doping region 21 and the second doping region 22, respectively.

In one embodiment, a silicon substrate having the first conductive type, such as p-type, is provided as the substrate 10 (often denoted as P-sub), while a HV deep well having the second conductive type, such as n-type, is provided as the deep well 15 (often denoted as HVNW). In one embodiment, the insulation 12 can be made of silicon dioxide (SiO2) or other suitable material.

In one embodiment, the first doping region 21 can be a p-type (i.e. the first conductive type) heavily doping region (often shown as P+), while the second doping region 22 can be an n-type (i.e. the second conductive type) heavily doping region (often shown as N+) for a diode. In the diode, the first doping region 21 and the second doping region 22 are an anode contact region and a cathode contact region, respectively. The contact to the first doping region 21 is so called as the anode, while the contact to the second doping region 22 is so called as the cathode. Alternatively, a field plate, made of material such as poly or metal material, can be used as the cathode for a diode, depending on the design of practical application.

Figure 2:
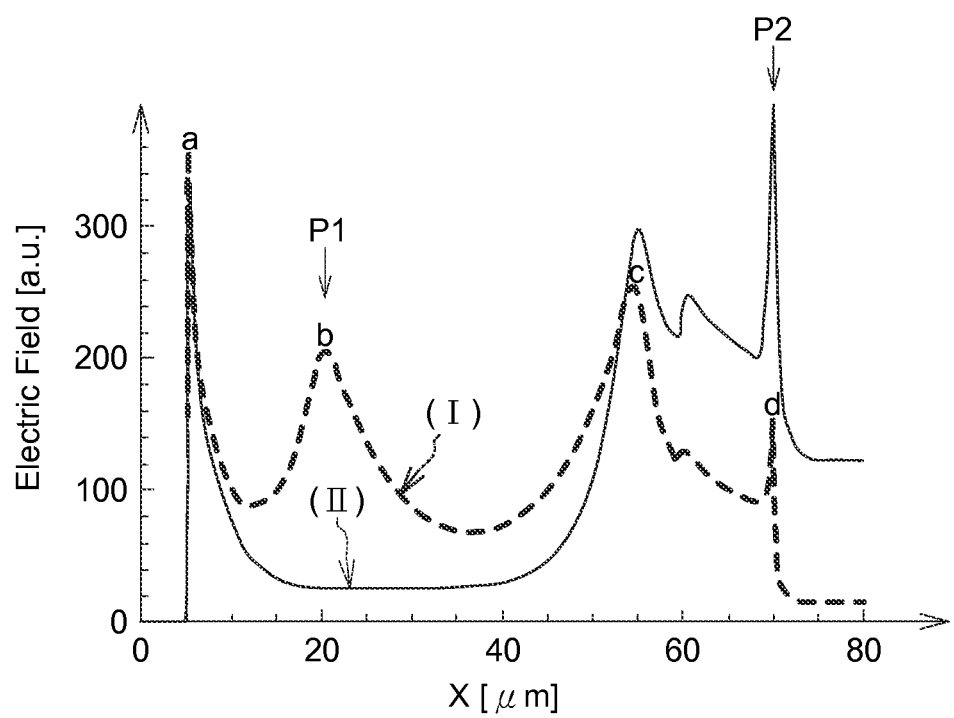
FIG. 2 depicts a comparison of the electric field between a partial SOI diode of FIG. 1 and a conventional SOI diode.

FIG. 2 depicts a comparison of the electric field between a partial SOI diode of FIG. 1 and a conventional SOI diode. As shown in FIG. 2, different electric field distributions of the diode of FIG. 1 and the conventional SOI diode are obtained. The curve (I) (with peaks a, b, c and d) represents the embodied diode of FIG. 1, and the curve (II) represents the conventional SOI diode. An interface between the air layer 13 and the insulation 12, such as the position P1 labeled in FIG. 1, is corresponding the peak b of the curve (I), while another interface between the air layer 13 and the insulation 12, such as the position P2 labeled in FIG. 1, is corresponding the peak d of the curve (I). Peak b of the electric field of the curve (I) is higher than the same position of the electric field of the curve (II), while peak c of the electric field of the curve (I) is lower than that of same position of the electric field of the curve (II). The peak d of electric field of the curve (I) has been reduced. However, it is clearly indicated in FIG. 2 that a total area under the curve (I) of the electrical field (Poisson's equation, integrated from electrical field to yield voltage) is larger than a total area under the curve (II). Accordingly, the breakdown voltage of the embodied HV device such as the partial SOI diode of FIG. 1 is higher than that of the conventional SOI diode. Thus, it is proven that the breakdown voltage of the embodied HV device is effectively increased, thereby improving the electrical performance of the HV device.

In one embodiment, one end of the air layer 13 can be positioned close to the first doping region 21, while the other end of the air layer 13 at least corresponds to (substantially aligned with) a sidewall of the second doping region 22; for example, the other end of the air layer 13 can be extended to correspond to the sidewall 222 of the second doping region 22. In one embodiment, one end of the air layer 13 is positioned close to a sidewall 212 of the first doping region 21, while the other end of the air layer 13 extends to overlap with the second doping region 22, such as across the bottom of the entire second doping region 22, as shown in FIG. 1. However, the present disclosure in the application is not limited to those configuration mentioned above. It is noted that the positions of two opposite ends of the air layer 13 can be adjusted according to the practical application for increasing the total area under the curve of the electrical field as shown in FIG. 2, so as to achieve the purpose of increasing the breakdown voltage. For example, the exact positions of two opposite ends of the air layer 13 of a diode applied by the embodiment of the present disclosure would be affected by the doping concentration of the deep well 15 (ex: HVNW).

Moreover, the pattern of the air layer 13 can be optionally modified and changed for the purpose of increasing the breakdown voltage. Please referred to FIG. 3A~FIG. 3C for the illustration, but not for limitation, of the embodiments.

Figure 3A:
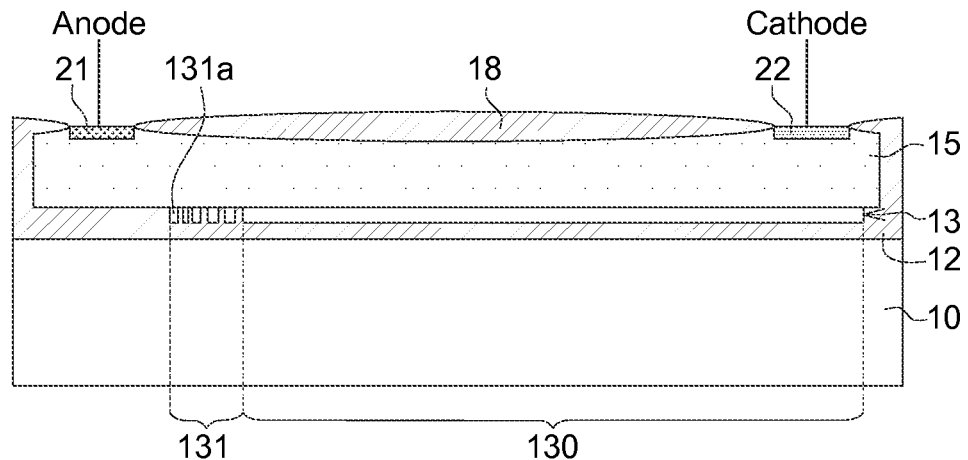
FIG. 3A illustrates another diode on partial SOI according to the first embodiment of the present disclosure, wherein the air layer comprises a patterned portion adjacent to the first doping region.
Figure 3B:
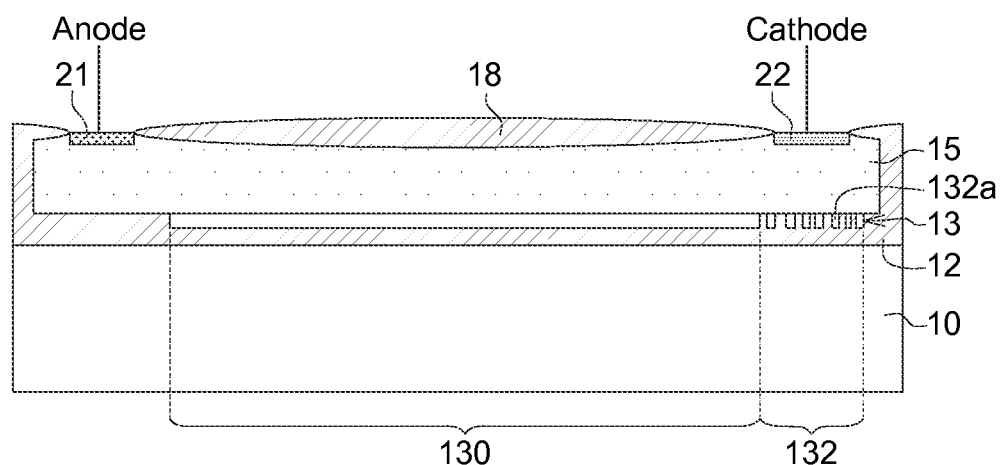
FIG. 3B illustrates a still another diode on partial SOI according to the first embodiment of the present disclosure, wherein the air layer comprises a patterned portion adjacent to the second doping region.
Figure 3C:
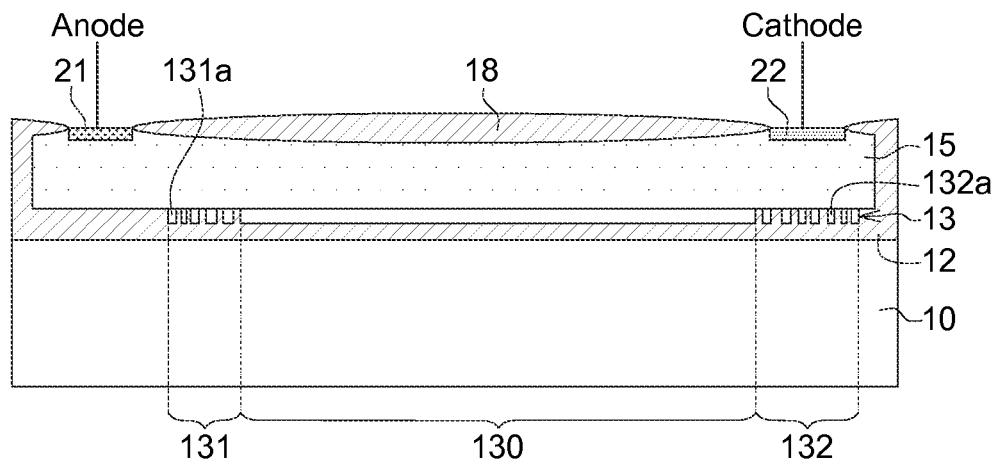
FIG. 3C illustrates a yet another diode on partial SOI according to the first embodiment of the present disclosure, wherein the air layer comprises both patterned portions adjacent to the first and second doping regions.

FIG. 3A illustrates another diode on partial SOI according to the first embodiment of the present disclosure, wherein the air layer comprises a patterned portion adjacent to the first doping region. FIG. 3B illustrates a still another diode on partial SOI according to the first embodiment of the present disclosure, wherein the air layer comprises a patterned portion adjacent to the second doping region. FIG. 3C illustrates a yet another diode on partial SOI according to the first embodiment of the present disclosure, wherein the air layer comprises both patterned portions adjacent to the first and second doping regions. Identical elements of the FIG. 3A~FIG. 3C and FIG. 1 are designated with the same reference numerals. The details of the elements, such as the insulation 12, the deep well 15, and first and second doping regions 21 and 22, have been described above and are not redundantly repeated.

In FIG. 3A, the air layer 13 comprises a body 130 and a first patterned portion 131 contiguous to the body 130, wherein the first patterned portion 131 is adjacent to the first doping region 21. In the embodiment, the first patterned portion 131 is composed of a plurality of first air regions 131*a* (ex: air hole) spaced apart from each other. The first air regions 131*a* can be apart from each other by the same distance or different distances, depending on actual requirement of the application. Also, the body 130 of the air layer 13 can be extended to the position below the entire bottom of the second doping region 22.

In FIG. 3B, the air layer 13 comprises a body 130 and a second patterned portion 132 contiguous to the body 130, wherein the second patterned portion 132 is adjacent to the second doping region 22. In the embodiment, the second patterned portion 132 is composed of a plurality of second air regions 132*a* (ex: air hole) spaced apart from each other. The second air regions 132*a* can be apart from each other by the same distance or different distances, depending on actual requirement of the application. In one embodiment, the second patterned portion 132 is corresponding to, but not limited to, the position below the bottom of the second doping region 22.

Alternatively, the air layer 13 may comprise a body 130, a first patterned portion 131 and a second patterned portion 132 contiguous to opposite sides of the body 130, as shown in FIG. 3C. In FIG. 3C, the first patterned portion 131 and the second patterned portion 132 of the air layer 13 are positioned adjacent to the first doping region 21 and the second doping region 22, respectively. Similarly, the first air regions 131*a* of the first patterned portion 131 and the second air regions 132*a* of the second patterned portion 132 can be arranged by spacing apart from each other in the same distance or different distances.

Additionally, the air layer 13 of some embodiment can communicate with the atmosphere outside the HV device, by means of tunnels or other adequate design, to dissipate heat generated during the operation of the HV device, thereby improving the electrical performance of HV device.

Figure 4A:
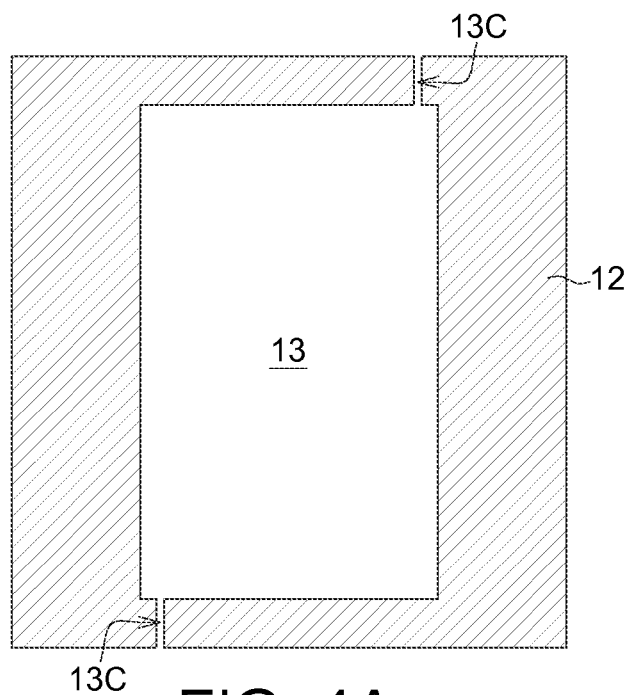
FIG. 4A~FIG. 4D show top views of the air layer in the insulation 12 according to four of the embodiments of the present disclosure.
Figure 4B:
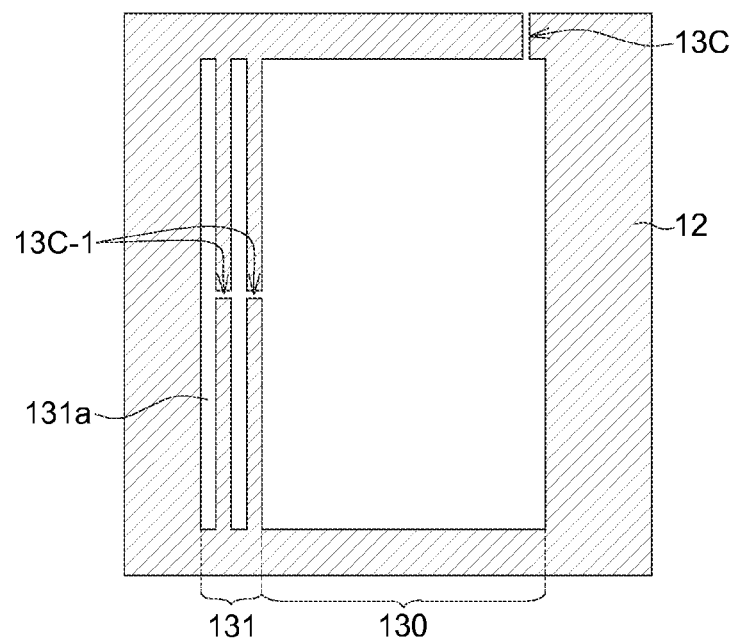

FIG. 4A~FIG. 4D show top views of the air layer in the insulation 12 according to four of the embodiments of the present disclosure. In FIG. 4A, the air layer 13 communicate with the atmosphere outside the HV device by the tunnels 13C. In FIG. 4B, the air layer 13 comprises the body 130 and the first patterned portion 131, wherein the first air regions 131*a* of the first patterned portion 131 communicate each other and with the body 130 by the tunnels 13C-1, while the heat is dissipated into the atmosphere by the tunnels 13C.

Figure 4C:
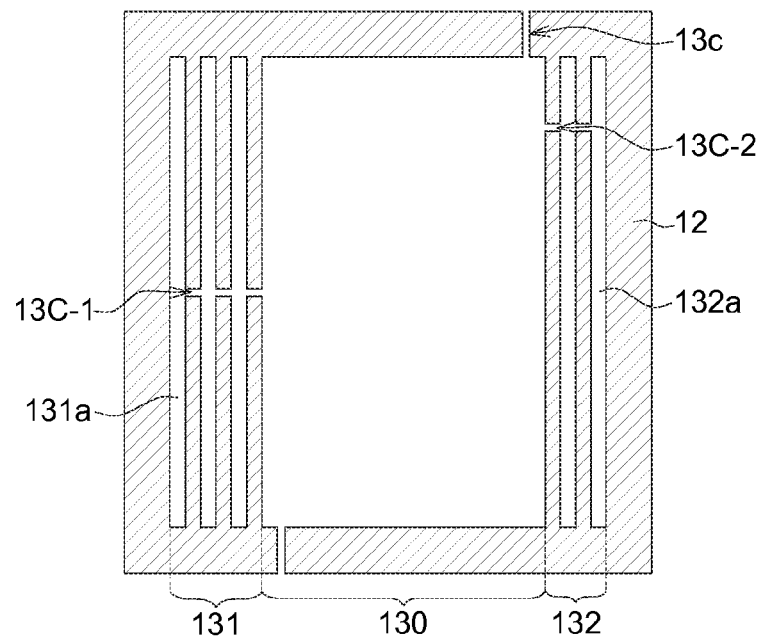
Figure 4D:
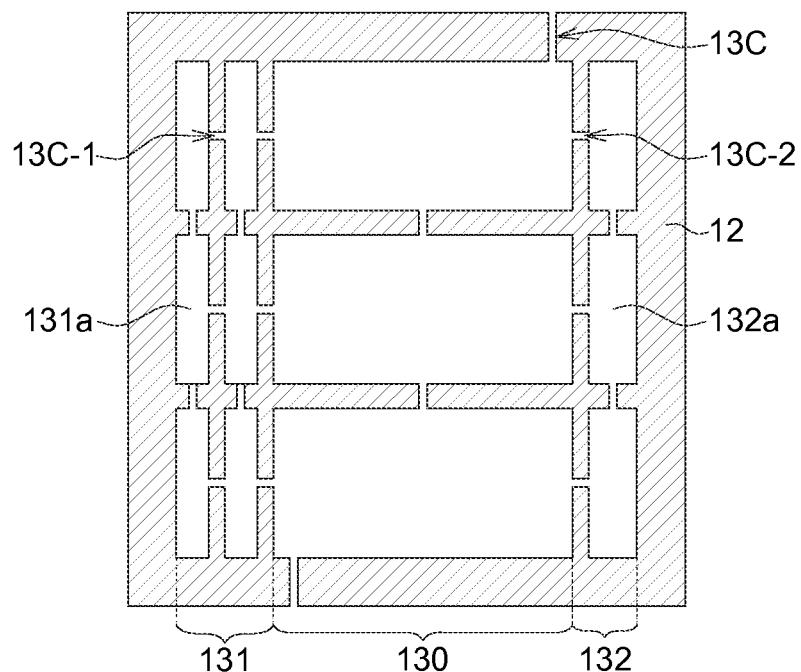

In FIGS. 4C and 4D, the air layer 13 comprises the body 130, the first patterned portion 131 and the second patterned portion 132, wherein the first air regions 131*a* of the first patterned portion 131 communicate each other and with the body 130 by the tunnels 13C-1, while the second air regions 132*a* of the second patterned portion 132 communicate each other and with the body 130 by the tunnels 13C-2. Also, the heat is dissipated into the atmosphere by the tunnels 13C.

It is noted that positions and quantities of the means for heat dissipation, such as the tunnels 13C, 13C-1, 13C-12 as shown in FIG. 4A~FIG. 4D, are not particularly limited, and can be optionally modified and changed, depending on the actual condition of the practical application, for achieving the optimal effect of heat dissipation.

Moreover, the pattern of the air layer 13 can be optionally modified and changed, as long as the breakdown voltage of the embodied HV device can be increased. For example, the air layer 13 of the embodiment may have a pattern comprising plural air regions as striped regions, dot regions, or island regions, or others. The present disclosure has no particular limitation thereto. In one embodiment, the air layer 13 of the embodiment may have a pattern comprising an air body and the air regions with at least one of those shapes. As shown in FIG. 4B and FIG. 4C, the pattern of the air layer 13 includes a body 130 and plural striped air regions (ex: 131*a*). As shown in FIG. 4D, the body 130 of the air layer 13 includes plural air islands with bigger size, while the first and second patterned portions 131 and 132 include plural air islands with smaller size. Also, the air regions and air body of the air layer 13 can be shaped as rectangular, circular, polygonal (ex: hexagonal, octagonal), or others. The present disclosure has no particular limitation thereto.

Second Embodiment

Figure 5:
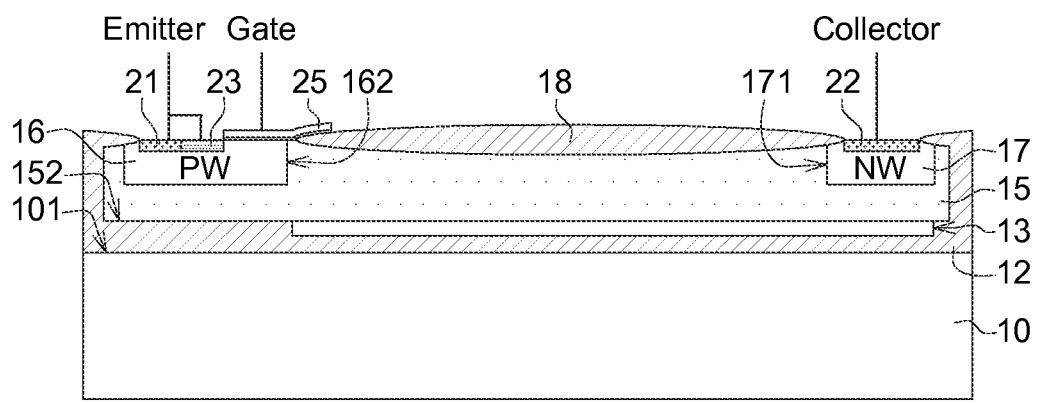
FIG. 5 illustrates a high voltage IGBT on partial SOI according to the second embodiment of the present disclosure.

In the second embodiment, configuration of the high voltage (HV) IGBT is exemplified for describing another one of the applicable HV devices of the present disclosure. FIG. 5 illustrates a high voltage IGBT on partial SOI according to the second embodiment of the present disclosure. Identical elements of the second and the first embodiments are designated with the same reference numerals. Some details of the elements, such as the substrate 10, the insulation 12, the air layer 13, the deep well 15, the first doping region 21 and a second doping region 22, have been described in the first embodiment and are not redundantly repeated.

As shown in FIG. 5, the high voltage IGBT further comprises a first well 16 and a second well 17 extending downwardly from the top surface 151 of the deep well 15. The first doping region 21 and the second doping region 22 with heavily doping concentrations are formed in the first well 16 and the second well 17, respectively. The first well 16 and the second well 17 are separated by the field oxide 18 formed on the top surface 151 of the deep well 15. The high voltage IGBT further comprises a third doping region 23 adjacent to the first doping region 21, and a gate layer 25 (such as a poly gate) formed on the top surface 151 of the deep well 15. The third doping region 23 with heavily doping concentration is formed in the first well 16 and electrically connected to the first doping region 21. The gate layer 25 is disposed between the third doping region 23 and the field oxide 18. A portion of the gate layer 25 overlaps the top of the field oxide 18.

In one embodiment, one end of the air layer 13 at least reaches (ex: substantially aligned with) a sidewall 162 of the first well 16 closest to the said end of the air layer 13. The other end of the air layer 13 at least reaches (ex: substantially aligned with) a sidewall 171 of the second well 17 closest to said other end of the air layer 13. As shown in FIG. 5, the other end of the air layer 13 extends and overlaps with the second well 17. Additionally, the air layer 13 for the IGBT may comprise a first patterned portion 131 and/or a second patterned portion 132 contiguous to a body 130, as shown in FIG. 3A~3C. Furthermore, the air layer 13 can communicate with the atmosphere outside the IGBT, by means of tunnels as shown in FIG. 4A~4D or other adequate design, to dissipate heat generated during the operation of the HV device. Please refer to the first embodiment, and those details are not redundantly repeated herein.

In one embodiment, the high voltage IGBT comprises the p-type substrate 10, the n-type deep well 15 (HVNW), the insulation 12 made of SiO2, the p-type first well 16 (PW), the n-type second well 17 (NW), the p-type first doping region 21, the p-type second doping region 22, the n-type third doping region 23. In FIG. 5, the first doping region 21 and the third doping region 23 function as an emitter of the IGBT, while the second doping region 22 functions as a collector of the IGBT.

According to the structure of the second embodiment, the breakdown voltage of the embodied HV device such as IGBT on partial SOI of FIG. 5 can be effectively increased, thereby improving the electrical performance of the HV device.

Additionally, the embodied diode (such as structures of FIG. 1 and FIG. 3A~FIG. 3C) and the embodied IGBT (such as structure of FIG. 5) could be used as a switch in circuit. Also, the embodied diode and the embodied IGBT could be used as a half bridge or a full bridge in circuit of a motor driver.

Third Embodiment

Figure 6:
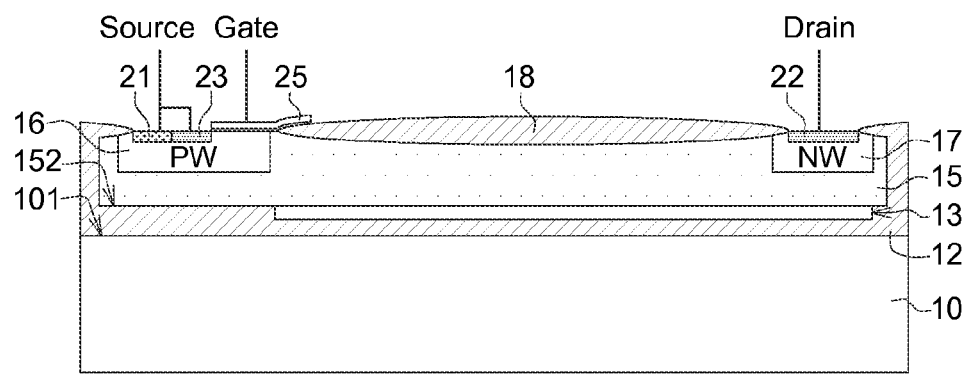
FIG. 6 illustrates a high voltage EDNMOS on partial SOI according to the third embodiment of the present disclosure.

In the third embodiment, configuration of the high voltage (HV) EDNMOS is exemplified for describing still another one of the applicable HV devices of the present disclosure. FIG. 6 illustrates a high voltage EDNMOS on partial SOI according to the third embodiment of the present disclosure. Identical elements of the third and the second embodiments are designated with the same reference numerals. Configurations of FIG. 5 and FIG. 6 are identical, except for doping types of the second doping regions 22. In the third embodiment, the n-type second doping region 22 is formed in the n-type second well 17 (NW) for an EDNMOS. In FIG. 6, the first doping region 21 and the third doping region 23 function a source of the EDNMOS, while the second doping region 22 functions as a drain of the EDNMOS.

The present disclosure can be applied for fabricating other DMOS. For example, the p-type first well 16 (PW) in the EDNMOS of FIG. 6 can be replaced by a p-body to form a LDMOS with the embodied feature.

According to the embodiments, the structural design of the HV devices can be altered to meet the actual requirement of practical application. In some embodiments, the structural design of HV LIGBT and HV MOS could be formed as the shape of rectangle, hexagonal, octagonal, circle, or runway pattern in the top view. The structural design of HV diode and HV BJT could be formed as the shape of square, rectangle, hexagonal, octagonal, or circle pattern in the top view.

<Manufacturing Method>

The high voltage (HV) device of the embodiment can be applied to various types of the HV devices. Accordingly, the method for manufacturing the high voltage (HV) device of the embodiment in details can be modified and changed depending on the types of the HV device in practical application. A method for manufacturing a HV diode, having structure as depicted in FIG. 1, is exemplified herein for illustration. It is known that other types of HV devices, such as BJT, IGBT, MOS (ex: EDNMOS), can be fabricated by modifying the similar method.

Figure 7A:
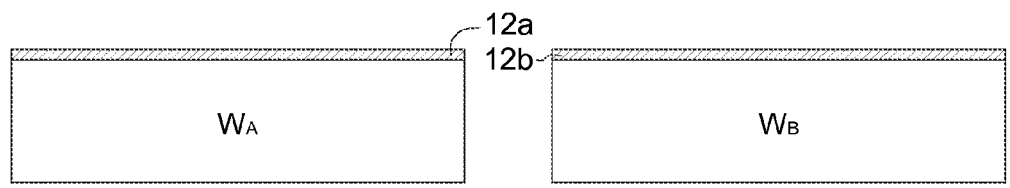
FIG. 7A~FIG. 7I illustrate a method of manufacturing a HV diode of the embodiment of the present disclosure, which adopts smart cut SOI bonding technology for forming the configuration of partial SOI.
Figure 7B:
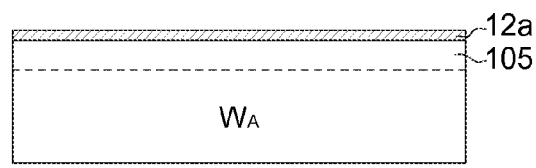
Figure 7C:
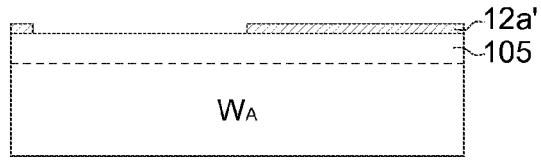
Figure 7D:
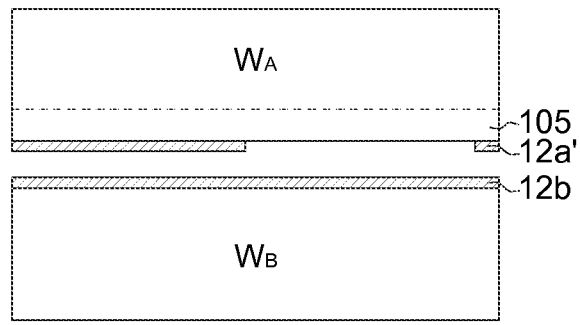
Figure 7E:
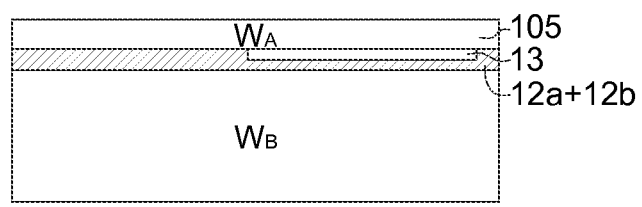

FIG. 7A~FIG. 7I illustrate a method of manufacturing a HV diode of the embodiment of the present disclosure, which adopts smart cut SOI bonding technology for forming the configuration of partial SOI. FIG. 7A~7E illustrate how to construct an air layer in the insulating layer. As shown in FIG. 7A, a first wafer $W_A$ with a first oxide layer 12a thereon, and a second wafer $W_B$ with a second oxide layer 12b thereon are provided. Next, implantation of hydrogen ions (H+) into the first wafer $W_A$ is conducted, so as to form a H+ layer 105 under the first oxide layer 12a, as shown in FIG. 7B. The first oxide layer 12a is then patterned to form a patterned first oxide layer 12a', as shown in FIG. 7C. After clean the first wafer $W_A$, the first wafer $W_A$ and the second wafer $W_B$ are assembled by bonding the patterned first oxide layer 12a' and the second oxide layer 12b, as shown in FIG. 7D. Thus, an air layer (i.e. 13 of FIG. 1) can be created in the insulating layer, wherein the insulating layer 12a+12b comprises the patterned first oxide layer 12a' and the second oxide layer 12b. Part of the first wafer $W_A$ is removed by splitting an un-implanted portion from the H+ layer 105 of the first wafer $W_A$, as shown in FIG. 7E.

Figure 7F:
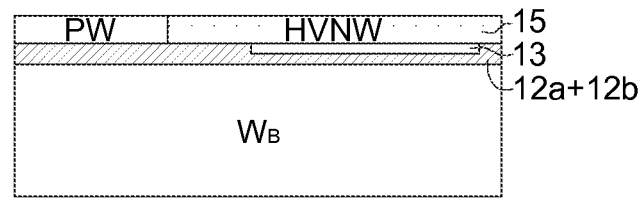
Figure 7G:
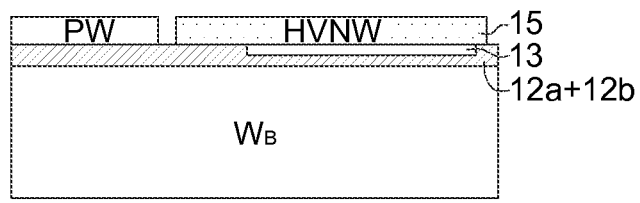
Figure 7H:
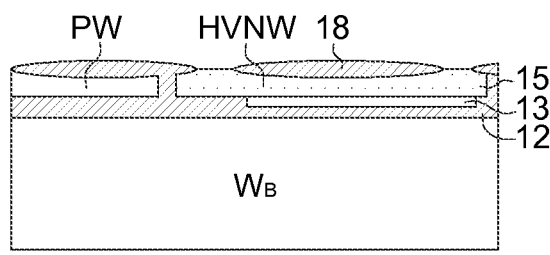
Figure 7I:
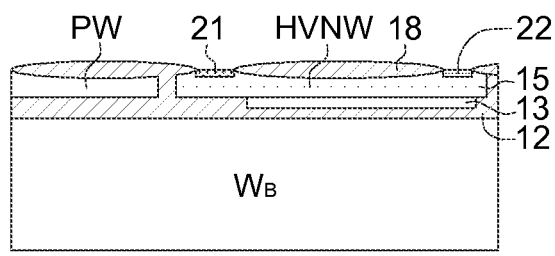

Afterward, formation of a deep well (i.e. 15 of FIG. 1) on the insulation is conducted. Steps of HVNW photo, HVNW implanted, PW photo, and PW implanted can be performed to form a HVNW layer and a PW layer, as shown in FIG. 7F. Then, steps of TEOS deposition, trench photo, and trench etching can be performed to form the trench 14 between the HVNW and the PW, as shown in FIG. 7G. After removing TEOS, steps of oxidation, deposition of SiN, active area photo, and field oxidation can be performed to form the field oxide 18 and the an insulation (i.e. 12 of FIG. 1), as shown in FIG. 7H. The insulation 12 comprises the insulating layer 12a+12b and the material of field oxide 18. After SiN removal and SAC oxidation, steps of N+ photo, N+ implanted, P+ photo, and P+ implanted can be performed to form the first doping region 21 and the second doping region 22, as shown in FIG. 7I.

In the manufacturing methods of the embodiments, local oxidation of silicon (LOCOS) process and shallow trench isolation (STI) process, DTI (deep trench isolation) process, N(P)-EPI and non-EPI process could be applied, according to the needs of procedures in practical application.

According to the aforementioned descriptions, the high voltage (HV) devices with partial SOI configurations and one of the manufacturing methods are provided. According to the embodiments, the electrical field of the embodied structure can be altered due to the formation of the air layer, so as to effectively increase the breakdown voltage of the HV devices. Additionally, the conventional problem of strong heat accumulation usually occurred during operation of the HV device can be solved by communicating the air layer with the atmosphere outside the HV device. Accordingly, the electrical performance of HV device of the embodiment can be greatly improved, by increasing the breakdown voltage of the device and providing heat dissipation way for the device. Additionally, the method for manufacturing the HV device of the embodiment, adopting the smart cut SOI bonding technology to form the configuration of partial SOI, is simple and easy to be conducted, thereby saving the time and cost for the production.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A high voltage (HV) device, at least comprising:
a substrate;
an insulation formed on the substrate;
a deep well formed in the insulation, wherein a bottom surface of the deep well is spaced apart from the substrate;
an air layer formed in the insulation and disposed adjacent to the bottom surface of the deep well;
a first doping region and a second doping region extending downwardly from a top surface of the deep well;
a first well and a second well extending downwardly from the top surface of the deep well, and the first doping region and the second doping region respectively formed in the first well and the second well; and
a third doping region adjacent to the first doping region and formed in the first well, wherein the third doping region is electrically connected to the first doping region,
wherein the air layer is interposed between the deep well and the substrate, and the air layer is spaced apart from the substrate,
wherein the first and second wells are a p-type well (PW) and a n-type well (NW) respectively formed in the n-type deep well, and the first doping region and the second doping region are p-type heavily (P+) doping regions, the third doping region is n-type heavily (N+) doping region for an insulated gate bipolar transistor (IGBT),
wherein the first and third doping regions function as an emitter of the IGBT, while the second doping region functions as a collector of the IGBT.

2. The HV device according to claim 1, wherein the air layer communicates with an atmosphere outside the HV device.

3. The HV device according to claim 1, wherein one end of the air layer comprises a first patterned portion contiguous to a body of the air layer, and the first patterned portion is composed of a plurality of first air regions spaced apart from each other.

4. The HV device according to claim 3, wherein the other end of the air layer comprise a second patterned portion contiguous to the body of the air layer, and the second patterned portion is composed of a plurality of second air regions spaced apart from each other.

5. The HV device according to claim 1,
wherein two opposite ends of the air layer are adjacent to the first doping region and the second doping region, respectively.

6. The HV device according to claim 5,
wherein two opposite ends of the air layer are positioned adjacent to the first well and the second well, respectively.

7. The HV device according to claim 6, further comprising:
a field oxide formed on the top surface of the deep well, and the first well and the second well separated by the field oxide,
wherein the third doping region is apart from the field oxide; and
a gate layer, formed on the top surface of the deep well, and disposed between the third doping region and the field oxide.

8. The HV device according to claim 6, wherein one end of said two opposite ends of the air layer at least reaches a sidewall of the first well closest to said end of the air layer; and
other end of said two opposite ends of the air layer at least reaches a sidewall of the second well closest to said other end of the air layer.

9. The HV device according to claim 8, wherein said other end of the air layer extends and overlaps with the second well.

10. A high voltage (HV) device, at least comprising:
a substrate;
an insulation formed on the substrate;
a deep well formed in the insulation, and a bottom surface of the deep well apart from the substrate; and
an air layer formed in the insulation and disposed adjacent to the bottom surface of the deep well, wherein the air layer is spaced apart from a top surface of the substrate,
wherein the air layer communicates with an atmosphere outside the HV device.

11. The HV device according to claim 10, wherein one end of the air layer comprises a first patterned portion contiguous to a body of the air layer, and the first patterned portion is composed of a plurality of first air regions spaced apart from each other, wherein the first air regions communicates with each other by first tunnels.

12. The HV device according to claim 11, wherein the other end of the air layer comprise a second patterned portion contiguous to the body of the air layer, and the second patterned portion is composed of a plurality of second air regions spaced apart from each other, wherein the second air regions communicates with each other by second tunnels.

13. The HV device according to claim 10, further comprising:
a first doping region and a second doping region extending downwardly from a top surface of the deep well,
wherein two opposite ends of the air layer are adjacent to the first doping region and the second doping region, respectively.

14. A method for manufacturing a high voltage (HV) device, at least comprising:
providing a substrate with an insulating layer thereon, and constructing an air layer in the insulating layer;
forming a deep well on the insulating layer, and a bottom surface of the deep well apart from the substrate; and
forming a field oxide on the deep well,
wherein the air layer is disposed adjacent to the bottom surface of the deep well, and spaced apart from the substrate, and the air layer is constructed for communicating with an atmosphere outside the HV device.

15. The method according to claim 14, wherein the step of providing the substrate with the insulating layer having the air layer comprises:
providing a first wafer with a first oxide layer thereon, and a second wafer with a second oxide layer thereon;
implanting hydrogen ions (H+) into the first wafer, so as to form a H+ layer under the first oxide layer;

patterning the first oxide layer to form a patterned first oxide layer;

assembling the first and second wafers by bonding the patterned first oxide layer and the second oxide layer, so as to form the air layer in the insulating layer, wherein the insulating layer comprises the patterned first oxide layer and the second oxide layer; and removing part of the first wafer, by splitting an un-implanted portion from the H+ layer of the first wafer.

16. The method according to claim 14, wherein at least one end of the air layer comprises a patterned portion contiguous to a body of the air layer, and the patterned portion is composed of a plurality of air regions spaced apart from each other.

17. The method according to claim 14, further comprising:

forming a first doping region and a second doping region extending downwardly from a top surface of the deep well, wherein two opposite ends of the air layer are adjacent to the first doping region and the second doping region, respectively.

* * * * *